(12) United States Patent
Zhang et al.

(10) Patent No.: US 12,176,350 B2
(45) Date of Patent: Dec. 24, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Kui Zhang, Hefei (CN); Yuhan Zhu, Hefei (CN); Jie Liu, Hefei (CN); Zhan Ying, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 436 days.

(21) Appl. No.: 17/503,475

(22) Filed: Oct. 18, 2021

(65) Prior Publication Data

US 2022/0102381 A1 Mar. 31, 2022

Related U.S. Application Data

(63) Continuation of application No. PCT/CN2021/105532, filed on Jul. 9, 2021.

(30) Foreign Application Priority Data

Sep. 30, 2020 (CN) .......................... 202011056617.7

(51) Int. Cl.
*H01L 27/12* (2006.01)
*H01L 21/84* (2006.01)
*H01L 23/535* (2006.01)
*H01L 27/13* (2006.01)

(52) U.S. Cl.
CPC .......... *H01L 27/1203* (2013.01); *H01L 21/84* (2013.01); *H01L 23/535* (2013.01); *H01L 27/13* (2013.01)

(58) Field of Classification Search
CPC ... H01L 27/1203; H01L 21/84; H01L 23/535; H01L 27/13; H01L 21/743; H01L 29/78642; H10B 12/05; H10B 12/315; H10B 12/482; H10B 12/485
See application file for complete search history.

(56) References Cited

U.S. PATENT DOCUMENTS

| | | | |
|---|---|---|---|
| 5,817,552 A | 10/1998 | Roesner | |
| 8,907,417 B2 | 12/2014 | Yang | |
| 9,082,755 B2* | 7/2015 | Kim | ................. H01L 29/41766 |
| 9,224,741 B2 | 12/2015 | Yang | |

(Continued)

FOREIGN PATENT DOCUMENTS

| | | |
|---|---|---|
| CN | 101090117 A | 12/2007 |
| CN | 107026087 A | 8/2017 |

(Continued)

*Primary Examiner* — Karen Kusumakar
(74) *Attorney, Agent, or Firm* — Kilpatrick Townsend & Stockton LLP

(57) ABSTRACT

A semiconductor structure and a manufacturing method thereof are provided. A semiconductor structure includes a semiconductor body, bit lines and word lines. The semiconductor body includes a substrate and an isolation structure positioned above the substrate and configured to isolate a plurality of active regions, part of each of the active regions being formed from the substrate. The bit lines are positioned in the substrate and are connected to the active regions. The word lines intersect with the active regions and surround the active regions. The substrate is Silicon On Insulator (SOI) substrate.

15 Claims, 22 Drawing Sheets

(56) References Cited

U.S. PATENT DOCUMENTS

| | | | |
|---|---|---|---|
| 2010/0090263 A1 | 4/2010 | Kunkel | |
| 2011/0140196 A1* | 6/2011 | Renn | H10B 12/36 257/329 |
| 2011/0227145 A1* | 9/2011 | Renn | H10B 12/34 257/E29.262 |
| 2013/0334583 A1 | 12/2013 | Yang | |
| 2015/0054066 A1 | 2/2015 | Yang | |

FOREIGN PATENT DOCUMENTS

| | | |
|---|---|---|
| CN | 108461496 A | 8/2018 |
| CN | 108878424 A | 11/2018 |
| CN | 109003938 A | 12/2018 |
| CN | 109309092 A | 2/2019 |
| CN | 110896074 A | 3/2020 |
| CN | 110931429 A | 3/2020 |
| CN | 110931487 A | 3/2020 |
| CN | 110957319 A | 4/2020 |

* cited by examiner

SEMICONDUCTOR STRUCTURE AND MANUFACTURING METHOD THEREOF

CROSS-REFERENCE TO RELATED APPLICATIONS

This is a continuation application of International Patent Application No. PCT/CN2021/105532, filed on Jul. 9, 2021, which claims priority to Chinese Patent Application 202011056617.7, filed on Sep. 30, 2020 and entitled "SEMICONDUCTOR STRUCTURE AND MANUFACTURING METHOD THEREOF". The disclosures of International Patent Application No. PCT/CN2021/105532 and Chinese Patent Application 202011056617.7 are incorporated by reference herein in their entireties.

BACKGROUND

With the increasing integration in a semiconductor manufacturing process, it is a tendency to improve the integration density of a memory.

A Dynamic Random Access Memory (DRAM) is a semiconductor memory, which includes an array region formed a plurality of memory cells and a peripheral region formed by a control circuit. Each memory cell includes a transistor electrically connected to a capacitor, and the transistor controls storage or release of charges in the capacitor to achieve the purpose of storing data. The control circuit may be located to each memory cell to control the access of the data thereof through a Word Line (WL) and a Bit Line (BL) which stretch across the array region and are electrically connected to each memory cell.

In an existing DRAM art, a buried type bit line structure is mainly adopted, which is greater in cell configuration size and limited in control ability.

SUMMARY

The disclosure relates to the technical field of semiconductors, and in particular to a semiconductor structure and a manufacturing method thereof.

According to a first aspect of the disclosure, a semiconductor structure is provided, including a semiconductor substrate, bit lines and word lines.

The semiconductor substrate includes a substrate and an isolation structure positioned above the substrate and configured to isolate a plurality of active regions, part of the active region being formed from the substrate.

The bit lines are positioned in the substrate and are connected to the active regions.

The word lines intersect with the active regions and surround the active regions.

The substrate is a Silicon On Insulator (SOI) substrate.

According to a second aspect of the disclosure, a manufacturing method of a semiconductor structure is provided, including the following operations.

A substrate is formed, which is an SOI substrate.

Bit lines are formed in the substrate.

A plurality of active regions are formed on the substrate, part of the active region being formed from the substrate, and the bit lines being connected to the active regions.

Word lines which intersect with the active regions and surround the active regions are formed above the bit lines.

BRIEF DESCRIPTION OF THE DRAWINGS

Various objects, features and advantages of the disclosure will become more apparent from the following detailed description of preferred embodiments of the disclosure in combination with the accompanying drawings. The drawings are only exemplary illustrations of the disclosure and are not necessarily drawn to scale. In the drawings, like reference numerals refer to the same or similar parts throughout.

DETAILED DESCRIPTION

Figure 1:
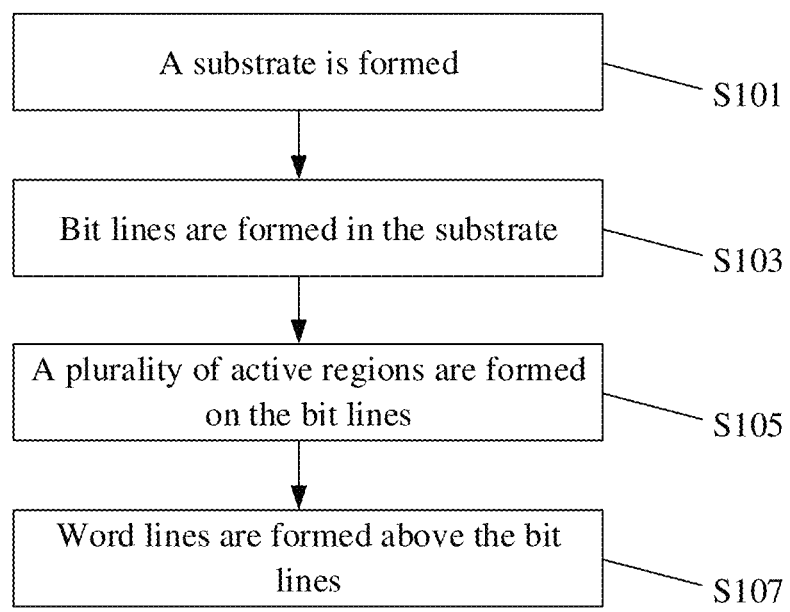
FIG. 1 is a flow chart of a manufacturing method of a semiconductor structure shown according to one exemplary embodiment.

Typical embodiments that embody the features and advantages of the disclosure will be described in detail in the following description. It is to be understood that the disclosure can be changed in different embodiments without departing from the scope of the disclosure, and that the description and drawings in the disclosure are illustrative in nature and are not intended to limit the disclosure.

In the following description of different exemplary embodiments of the disclosure, reference is made to the accompanying drawings, which form a part of the disclosure, and in which different exemplary structures, systems, and steps for implementing various aspects of the disclosure are shown by way of an example. It is to be understood that other specific solutions of a part, a structure, an exemplary device, a system, and a step may be utilized, and a structural and functional modification may be made without departing from the scope of the disclosure. Moreover, although terms "above", "between", "within", and the like may be used in the specification to describe different exemplary features and elements of the disclosure, these terms are used herein for convenience only, for example, according to a direction of the example in the drawings. Any content in the specification should not be construed as requiring a specific three-dimensional direction of the structure to fall within the scope of the disclosure.

One embodiment of the disclosure provides a manufacturing method of a semiconductor structure. Referring to FIG. 1, the manufacturing method of a semiconductor structure includes the following operations.

S101, a substrate 12 is formed, which is an SOI substrate.

S103, bit lines 20 are formed in the substrate 12.

S105, a plurality of active regions 11 are formed on the substrate 12, part of the active region 11 being formed from the substrate 12, and the bit lines 20 being connected to active regions 11.

S107, word lines 30 intersecting with the active regions 11 and surrounding the active regions 11 are formed above the bit lines 20.

According to the manufacturing method of the semiconductor structure in one embodiment of the disclosure, the buried type bit lines 20 are formed in the substrate 12, and active regions 11 and the word lines 30 are formed above the bit lines 20. The bit lines 20 are connected to the active regions 11 and the word lines 30 intersect with the active regions 11. In this way, line contact hole for connecting the bit line 20 to the active region 11 is omitted. Moreover, a unit configuration size on the substrate 12 is small, i.e., the size of the semiconductor structure may be further reduced, and the control ability of the buried type bit line 20 is stronger, so that the performance of the semiconductor structure is improved.

It is to be noted that, part of the active region 11 is formed from the substrate 12, i.e., at least a semiconductor material layer is arranged above the substrate 12.

It needs to be indicated that, a vertical type memory transistor is formed in an overlapped area in which the bit line 20 intersects spatially with the word line 30, the vertical type memory transistor is positioned on the bit line 20 and connected to the bit line 20, and one overlapped area corresponds to one vertical type memory transistor. The vertical type memory transistor includes the active region 11

In the related art, when a width size, in a direction perpendicular to the word line, of one memory transistor is 3F, and a width size, in a direction perpendicular to the bit line, of one memory transistor is 2F, the area of one memory transistor that needs to be configured on the substrate is 6F2 (3F*2F, namely a 3×2 buried type word line structure). F is the minimum feature size, that is, the minimum limit line width size and the minimum limit line spacing size obtained based on the resolution of a current lithography apparatus. The minimum limit line width size and the minimum limit line spacing size are equal. Based on the resolution of the current lithography apparatus, the unit size of the manufactured memory transistor may only reach 6F2, which may not be further reduced.

The "unit configuration size" refers to a unit configuration size that needs to be configured on a substrate for one memory cell, and the size specifically includes a size on the substrate practically needing to be occupied by a memory cell, and a spacing size needing to be reserved between the memory cell and an adjacent memory cell. For example, when the size occupied on the substrate by N memory transistors is M, the unit configuration size of one memory transistor on the substrate is M/N. For the vertical type memory transistor based on a vertical structure, the word line and the bit line are spatially intersected with each other and there is an overlapped area between the word line and the bit line. One overlapped area corresponds to one vertical type memory transistor.

According to the semiconductor structure manufactured in the embodiment, the bit line 20 and the word line 30 with the minimum feature size F may be formed according to related preparation processes, and line spacing between adjacent formed bit lines 20 and line spacing between adjacent formed word lines 30 are greater than or equal to the minimum feature size F. As such, the width size, in the direction perpendicular to the bit line, of a vertical type memory transistor is 2F and the width size, in the direction perpendicular to the word line, of the vertical type memory transistor is also 2F. As a result, the unit configuration size of the vertical type memory transistor may be 4F2 correspondingly (2F*2F, namely a 2×2 buried type bit line structure). That is, the unit configuration size of the vertical type memory transistor is greater than or equal to 4 times the square of the minimum feature size. Compared with a 3×2 buried type word line structure, the unit configuration size is smaller, namely bulk density is higher.

In one embodiment, the manufacturing method of the semiconductor structure further includes: an isolation structure 13 covering the substrate 12 is formed. The word lines 30 and the active regions 11 are positioned in the isolation structure 13.

In one embodiment, the operation that the substrate 12 is formed includes the following operations. A first semiconductor layer 121 is provided. An oxide insulation layer 122 is formed on the first semiconductor layer 121. A second semiconductor layer 123 is formed on the oxide insulation layer 122.

Specifically, the first semiconductor layer 121 may be formed of a silicon-containing material. The first semiconductor layer 121 may be formed of any proper material, for example including at least one of silicon, monocrystalline silicon, polysilicon, amorphous silicon, silicon germanium, monocrystalline silicon germanium, polysilicon germanium or carbon doped silicon.

The oxide insulation layer 122 may include materials such as silicon dioxide (SiO2) and silicon oxycarbide (SiOC).

The second semiconductor layer 123 may be formed of a silicon-containing material. The second semiconductor layer 123 may be formed by any proper material, for example including at least one of silicon, monocrystalline silicon, polysilicon, amorphous silicon, silicon germanium, monocrystalline silicon germanium, polysilicon germanium or carbon doped silicon.

It is to be noted that, the first semiconductor layer 121, the oxide insulation layer 122 and the second semiconductor layer 123 form a Silicon-On-Insulator (SOI) in which the bit line 20 is arranged.

In one embodiment, a thickness of the oxide insulation layer 122 is greater than 100 nm, and a thickness of the second semiconductor layer 123 is 18 nm to 22 nm.

In one embodiment, the operation that the bit lines 20 are formed includes the following operations. Openings 40 are formed in the substrate 12, a bottom surface of the opening 40 being positioned in the oxide insulation layer 122. The bit lines 20 are formed in the openings 40. A top end of the bit line 20 is not higher than a lower surface of the second semiconductor layer 123, namely the bit line 20 is buried into the oxide insulation layer 122.

Figure 2:
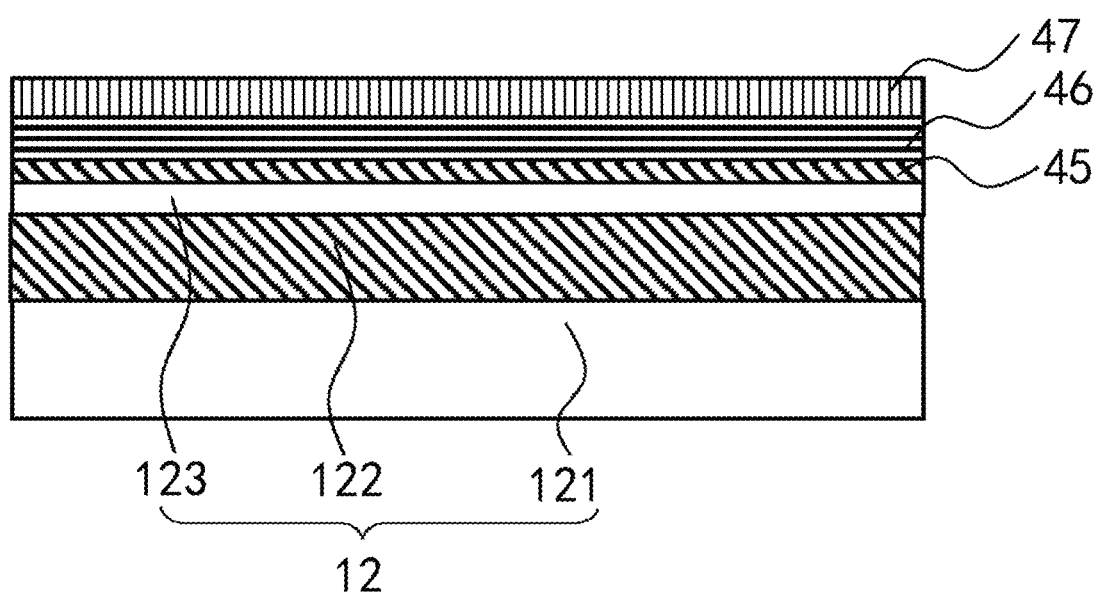
FIG. 2 is a structural schematic diagram illustrating that a substrate and a mask layer are formed in a manufacturing method of a semiconductor structure according to one exemplary embodiment.
Figure 3:
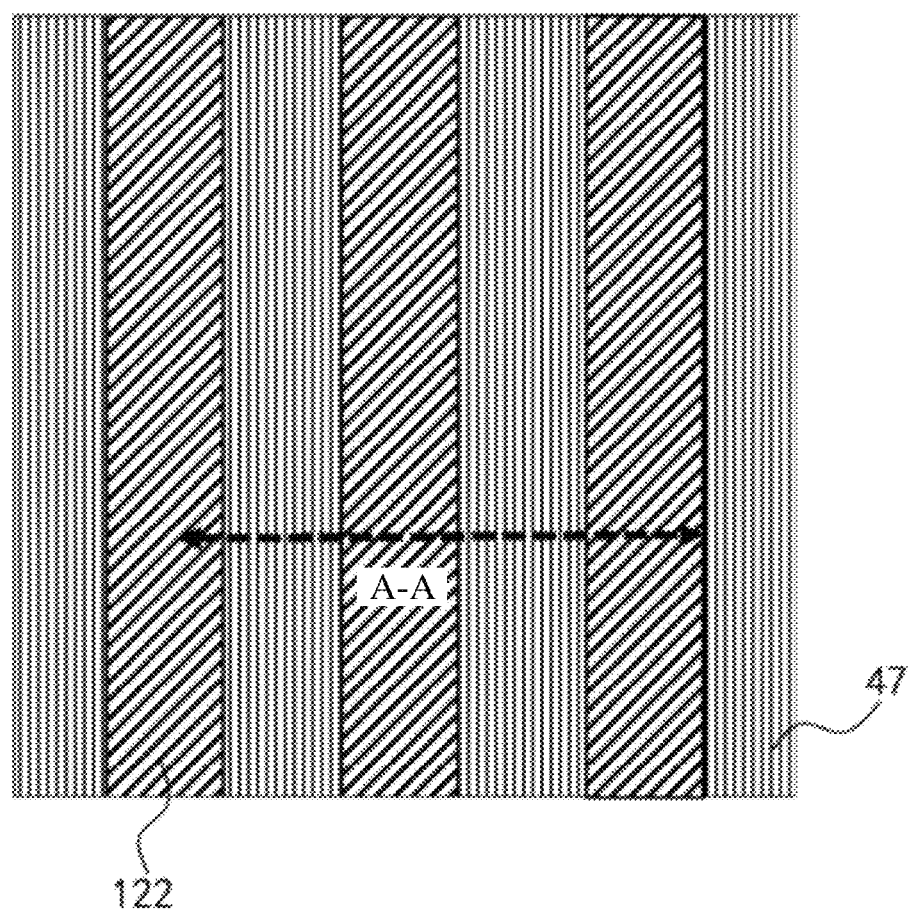
FIG. 3 is a structural top view illustrating that openings are formed in a manufacturing method of a semiconductor structure according to one exemplary embodiment.
Figure 4:
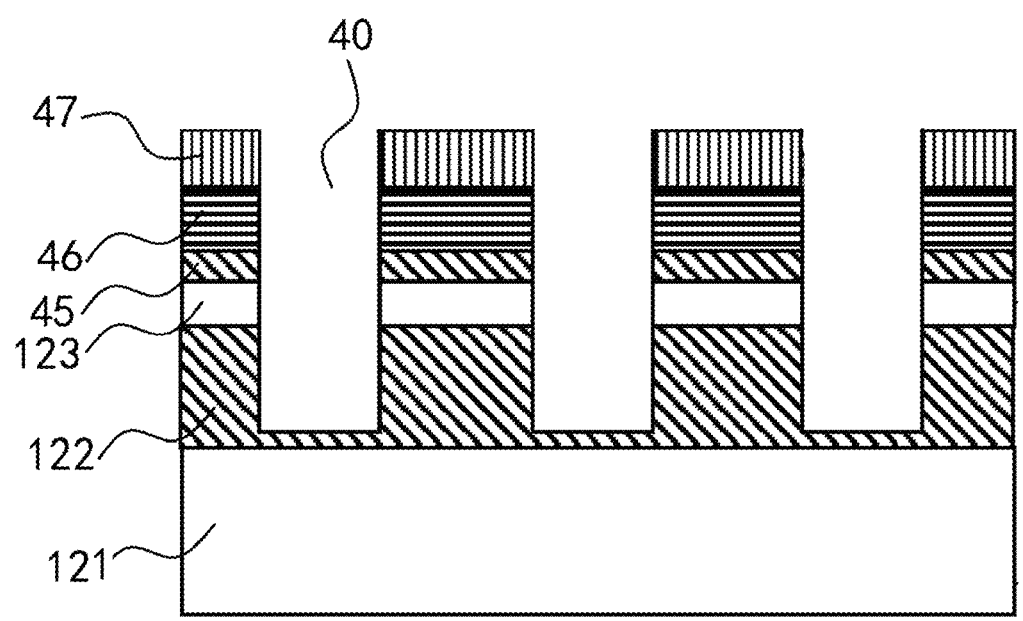
FIG. 4 is a cross-sectional structural view at A-A in FIG. 3.

In one embodiment, referring to FIG. 2, a mask layer covers the SOI formed from the first semiconductor layer 121, the oxide insulation layer 122 and the second semiconductor layer 123, and a mask pattern is formed on the mask layer. The mask pattern corresponds to areas in which the bit lines 20 are located (three-dimensional space herein, i.e., upper and lower spaces on the basis of a plane on which the bit line 20 is located, are the area in which the bit line 20 is located), and the area in which the mask pattern is located is etched to form openings 40, please refer to FIG. 3 and FIG. 4 for details. The bit lines 20 are finally formed in the openings 40, please refer to FIG. 5 and FIG. 6 for details.

In one embodiment, the mask layer includes an oxide layer 45, a nitride layer 46 and photoresist 47. Referring to FIG. 2, the oxide layer 45 is formed on the second semiconductor layer 123, the nitride layer 46 is formed on the oxide layer 45, and the photoresist 47 is formed on the nitride layer 46. The openings 40 are formed by lithography etching. The opening 40 does not penetrate through the oxide insulation layer 122, and has a depth of 40 nm to 70 nm and a width of 30 nm to 70 nm in the oxide insulation layer 122.

It is to be noted that, the oxide insulation layer 122, the oxide layer 45, the nitride layer 46 and the photoresist 47 may be formed through a Physical Vapor Deposition (PVD) process, a Chemical Vapor Deposition (CVD) process or an Atomic Layer Deposition (ALD) process.

In one embodiment, the bit line 20 includes: a bit line isolation layer 21 positioned in the oxide insulation layer 122; a blocking layer 22 covering an inner surface of the bit line isolation layer 21; and an electrically conductive layer 23 arranged in the blocking layer 22, the blocking layer 22 covering an upper surface of the electrically conductive layer 23. The blocking layer 22 is connected to the active region 11.

Figure 5:
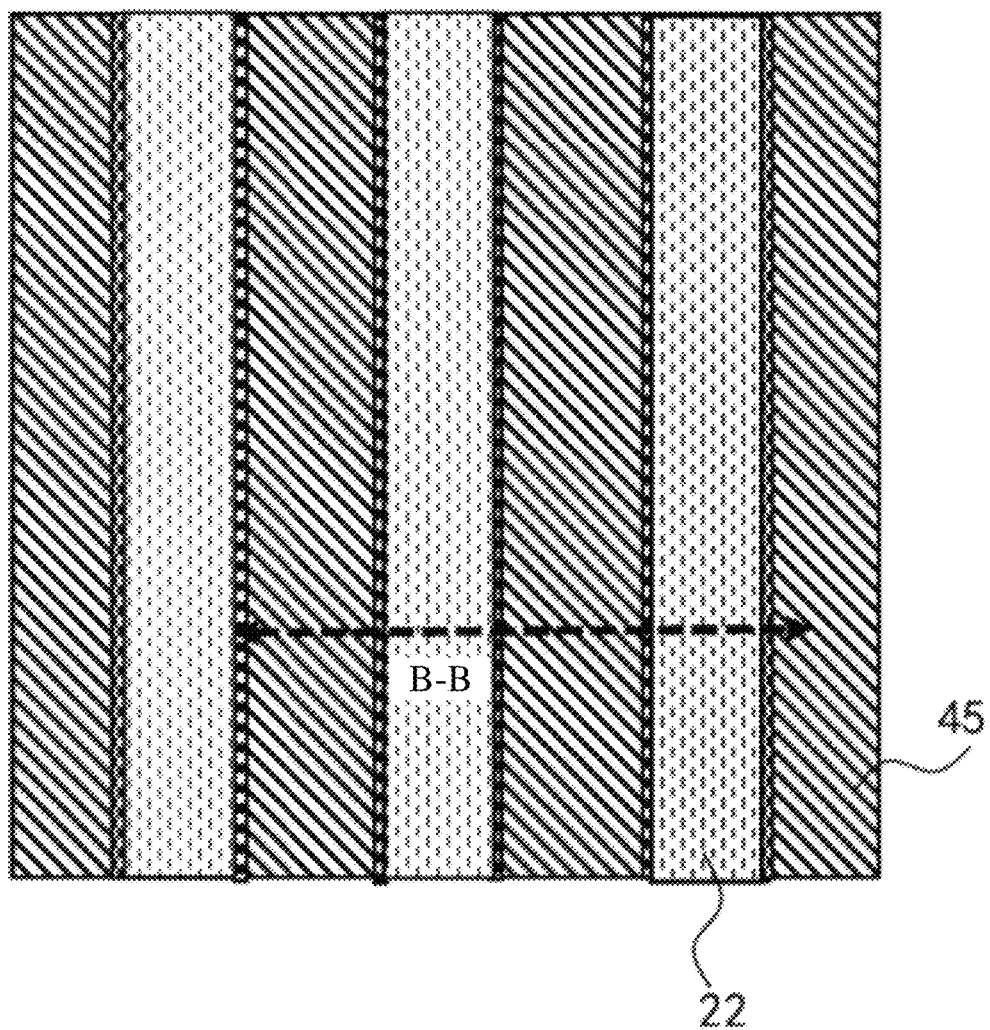
FIG. 5 is a structural top view illustrating that bit lines are formed in a manufacturing method of a semiconductor structure according to one exemplary embodiment.
Figure 6:
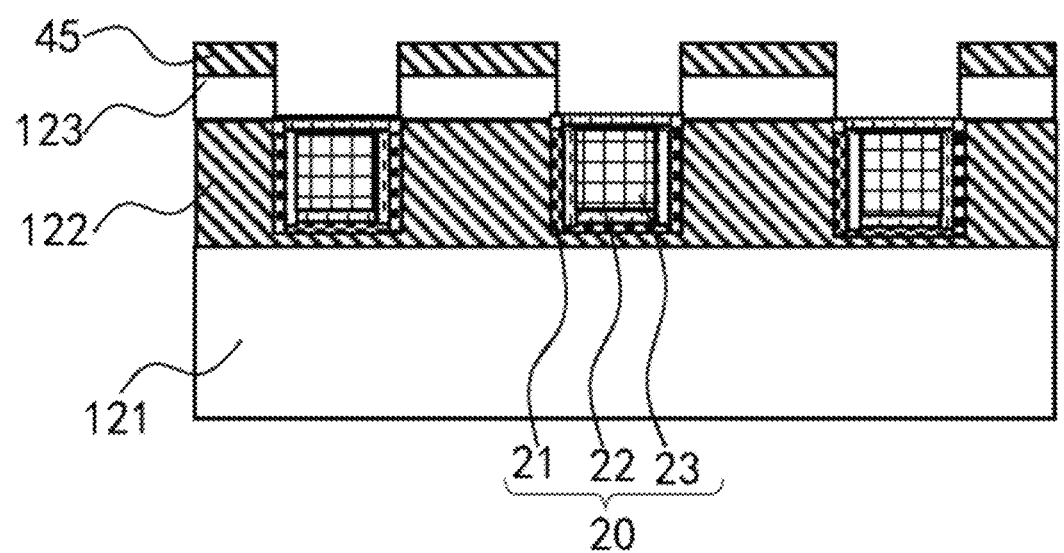
FIG. 6 is a cross-sectional structural view at B-B in FIG. 5.

Reference is made to FIG. 5 and FIG. 6, a bit line isolation layer 21 which covers an inner surface of the opening 40 is formed in the opening 40. A blocking layer 22 which covers an inner surface of the bit line isolation layer 21 is formed in the opening 40. An electrically conductive layer 23 is filled in the opening 40. Finally, an upper surface of the electrically conductive layer 23 is covered with the blocking layer 22. The blocking layer 22 may only cover an upper surface of the electrically conductive layer 23 to expose an upper surface of the bit line isolation layer 21. It is certain that the blocking layer 22 may completely cover the upper surface of the electrically conductive layer 23 and the upper surface of the bit line isolation layer 21.

Specifically, the bit line isolation layer 21 may include materials such as silicon nitride (SiN) and nitrogen silicon carbide (SiCN). The blocking layer 22 may include at least one of tungsten silicide (WSi), titanium nitride (tin) or titanium (TI), and the electrically conductive layer 23 may include tungsten (W).

It is to be noted that, the bit line isolation layer 21, the blocking layer 22 and the electrically conductive layer 23 may be formed through a PVD process, a CVD process, an ALD process, a Remote Plasma Nitridization (RPN) process, a thermal oxidization process, and the like, which may be not limited herein.

In one embodiment, an operation that active regions 11 are formed includes the following operations. A drain region 111 is formed on the bit line 20; a source region channel 112 is formed on the drain region 111; and a source region 113 is formed on the source region channel 112. That is, the drain region 111, the source region channel 112 and the source region 113 are sequentially arranged in the vertical direction to form a three-dimensional type active region 11.

In one embodiment, an operation that active regions 11 are formed includes the following operations. A third semiconductor layer 41 which covers upper surfaces of the bit lines 20 is formed on the second semiconductor layer 123; and the second semiconductor layer 123 and the third semiconductor layer 41 are partially etched, and the rest of the second semiconductor layer 123 and of the third semiconductor layer 41 are taken as first segment bodies 1111.

Figure 7:
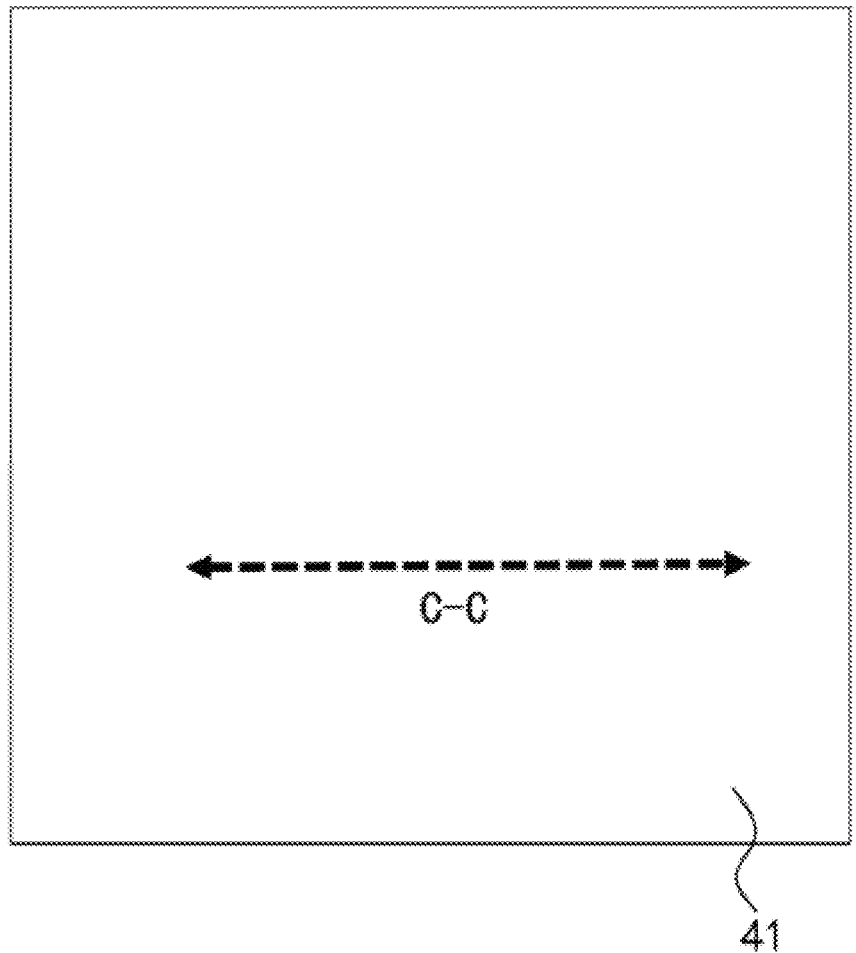
FIG. 7 is a structural top view illustrating that a third semiconductor layer is formed in a manufacturing method of a semiconductor structure according to one exemplary embodiment.
Figure 8:
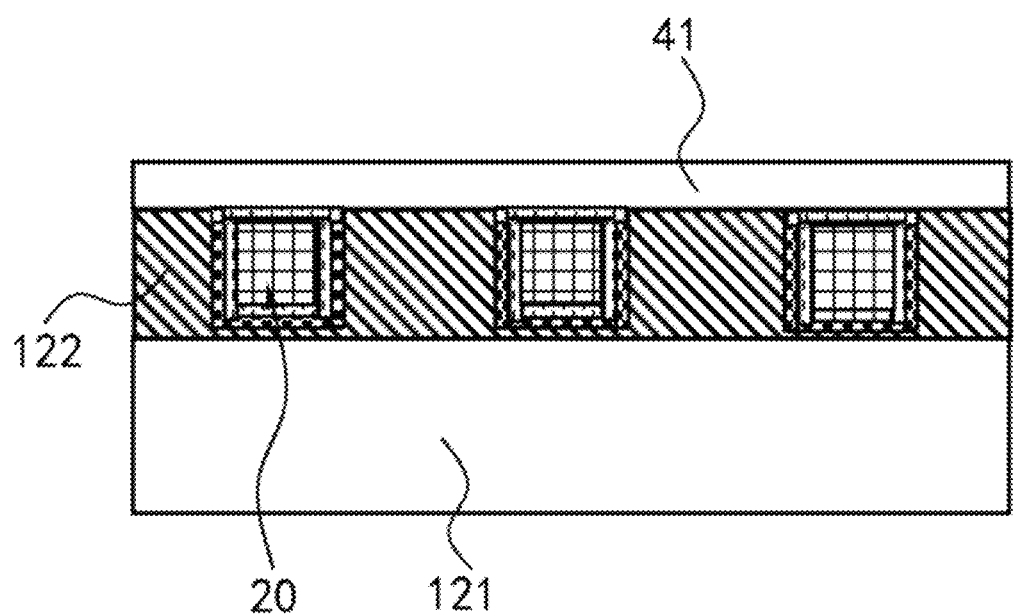
FIG. 8 is a cross-sectional structural view at C-C in FIG. 7.

Specifically, after the bit lines 20 are formed, the mask layer covering the second semiconductor layer 123 is removed, and the third semiconductor layer 41 is formed on the second semiconductor layer 123. As shown in FIG. 7 and FIG. 8, the third semiconductor layer 41 covers the bit lines 20. The second semiconductor layer 123 and the third semiconductor layer 41 may be the same material.

Figure 9:
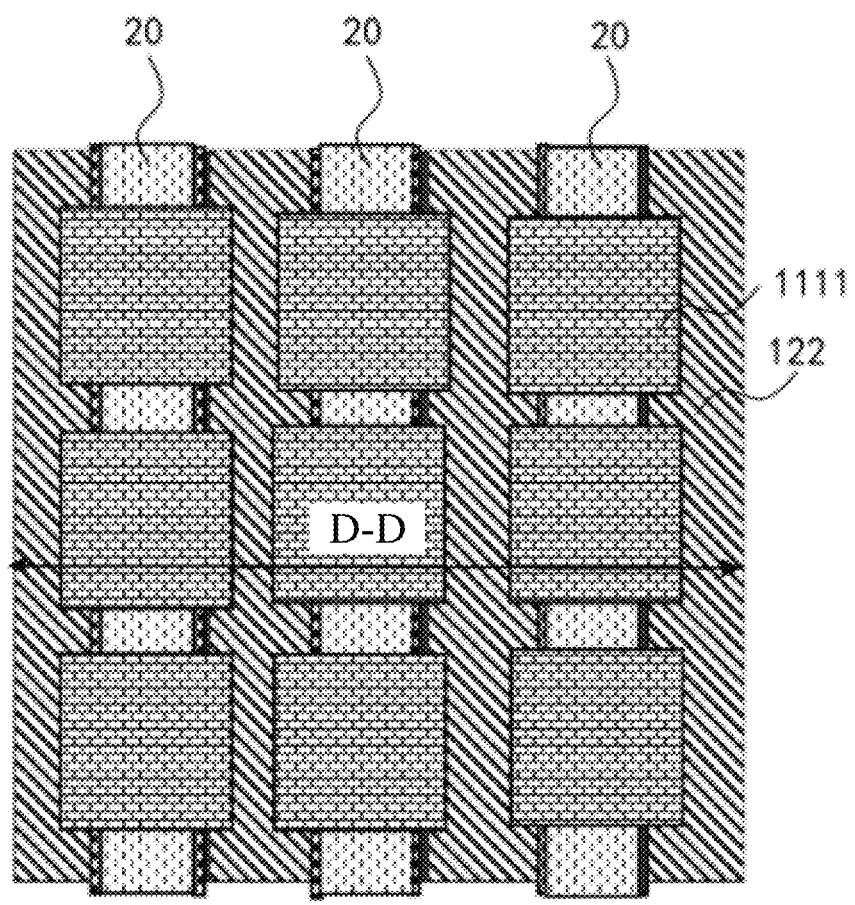
FIG. 9 is a structural top view illustrating that drain regions are formed in a manufacturing method of a semiconductor structure according to one exemplary embodiment.
Figure 10:
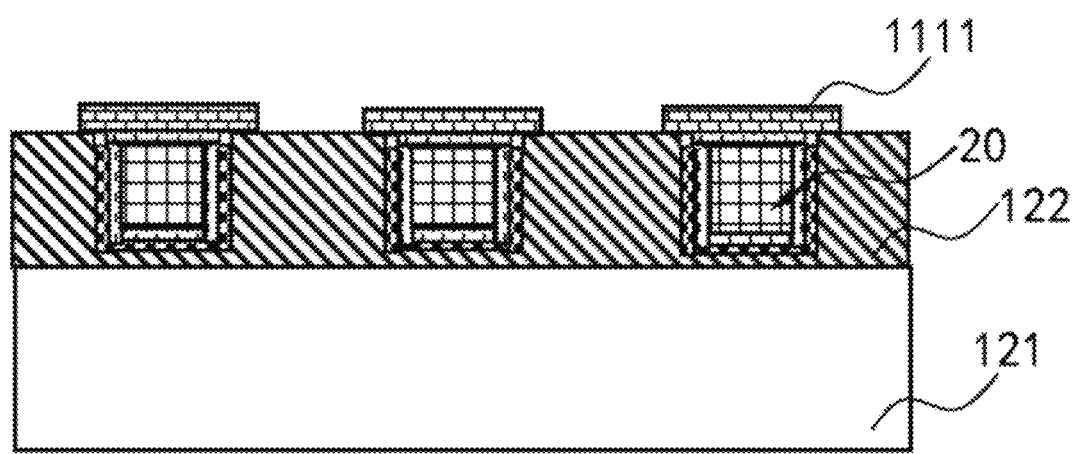
FIG. 10 is a cross-sectional structural view at D-D in FIG. 9.

The third semiconductor layer 41 is covered with a mask layer, and a mask pattern, corresponding to areas in which first segment bodies 1111 are located, is formed on the mask layer. The second semiconductor layer 123 and the third semiconductor layer 41 outside the mask pattern are etched, and the rest of the second semiconductor layer 123 and of the third semiconductor layer 41 are taken as a plurality of first segment bodies 1111 which are arranged at intervals, as shown in FIG. 9 and FIG. 10. In the embodiment, a width of the first segment body 1111 is greater than a width of the bit line 20. Further, the width of the first segment body 1111 is greater than the width of the bit line 20 by 3 nm to 10 nm.

In one embodiment, an operation that active regions 11 are formed further includes the following operations. A first insulating medium layer 131 is formed on the oxide insulation layer 122 and side walls of the first segment bodies 1111 are covered with the first insulating medium layer 131. A first mask layer 53 is formed on the first insulating medium layer 131 and the first segment bodies 1111. A first oxide layer 48 is formed on the first mask layer 53. An electrically conductive material layer 44 is formed on the first oxide layer 48. A second oxide layer 49 is formed on the electrically conductive material layer 44. A second mask layer 54 is formed on the second oxide layer 49. The second mask layer 54, the second oxide layer 49, the electrically conductive material layer 44, the first oxide layer 48 and the first mask layer 53 in areas in which the first segment bodies 1111 are located are partially etched to expose the first segment bodies 1111 and form holes 50. A third oxide layer 52 is formed on a wall of each of the holes 50, and the first oxide layer 48, the second oxide layer 49 and the third oxide layer 52 are taken as a gate oxide layer 132. A fourth semiconductor layer 42 is formed in each of the holes 50. The fourth semiconductor layers 42 in the first mask layer 53 are taken as second segment bodies 1112. The first segment bodies 1111 and the second segment bodies 1112 are taken as drain regions 111, the fourth semiconductor layers 42 in the second mask layer 54 are taken as source regions 113, and the rest of the fourth semiconductor layers 42 are taken as source region channels 112. The drain regions 111, the source region channels 112 and the source regions 113 are taken as the active regions 11.

Figure 11:
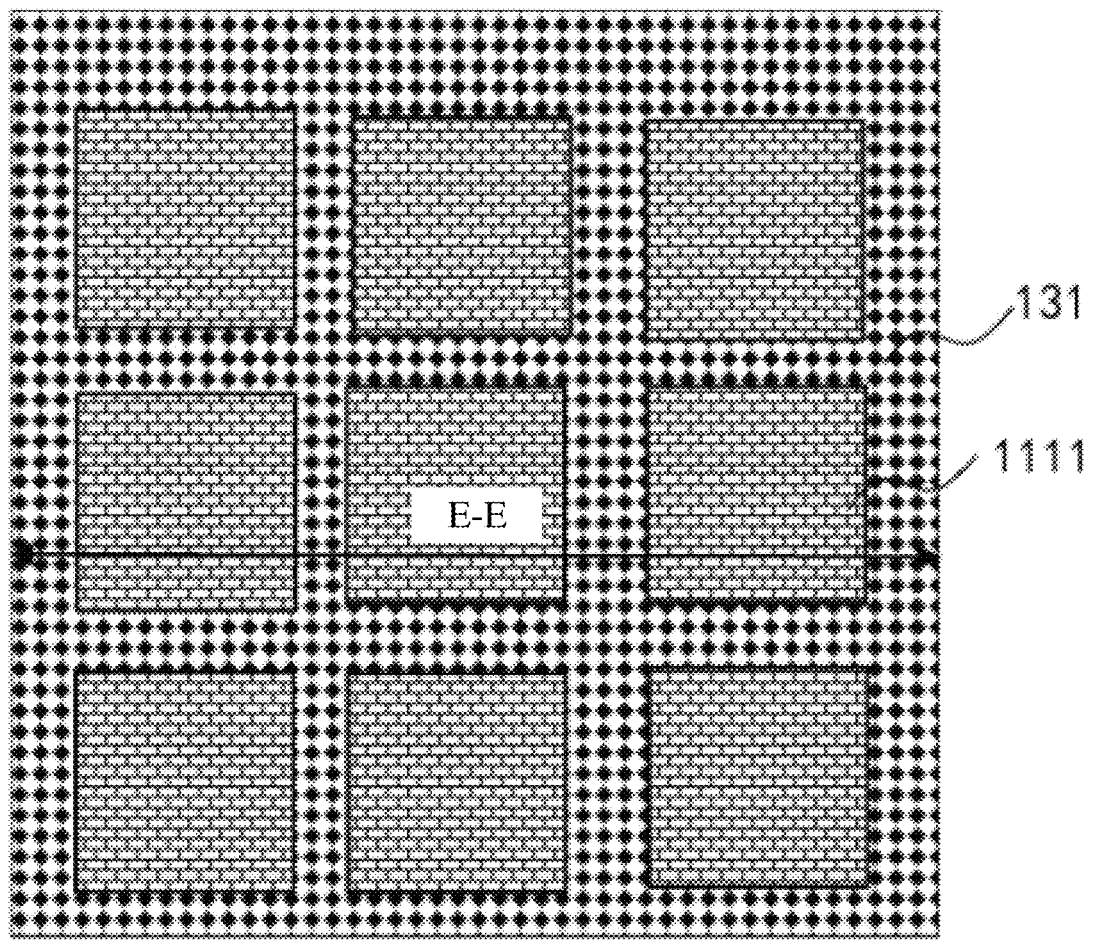
FIG. 11 is a structural top view illustrating that a first insulating medium layer is formed in a manufacturing method of a semiconductor structure according to one exemplary embodiment.
Figure 12:
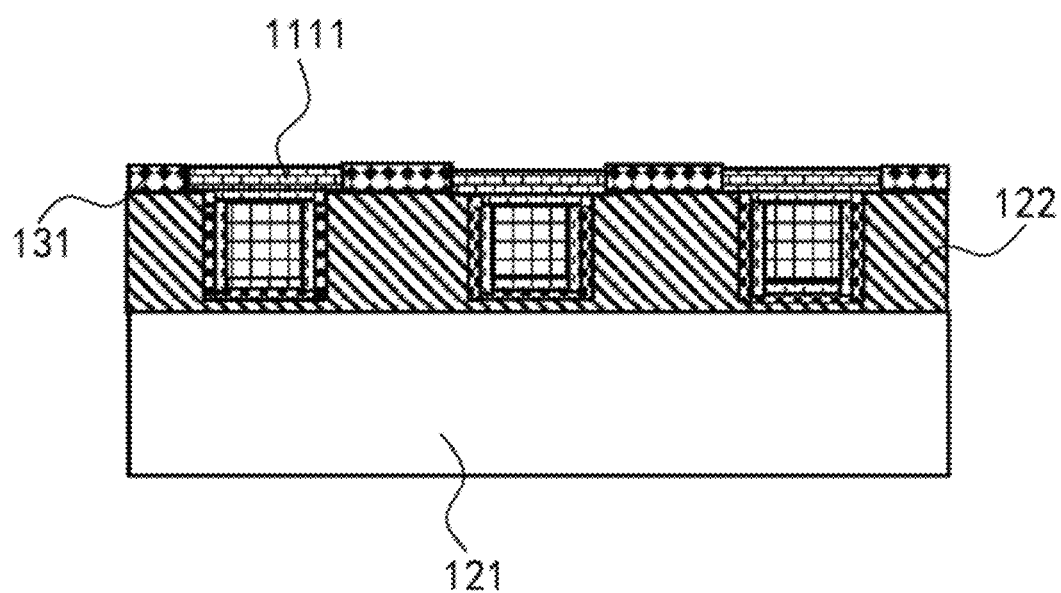
FIG. 12 is a cross-sectional structural view at E-E in FIG. 11.

Specifically, on the basis of FIG. 9 and FIG. 10, i.e., after the first segment bodies 1111 are formed, a first insulating medium layer 131 which covers the side walls of the first segment bodies 1111 is formed on the oxide insulation layer 122, as shown in FIG. 11 and FIG. 12.

On the basis of FIG. 11 and FIG. 12, a first mask layer 53, a first oxide layer 48, an electrically conductive material layer 44, a second oxide layer 49 and a second mask layer 54 are sequentially formed on the first insulating medium layer 131 and the first segment bodies 1111. Specifically, as shown in FIG. 13 and FIG. 14, the first mask layer 53 may be nitrogen silicon carbide (SiCN), silicon oxycarbide (SiOC) and the like.

Figure 13:
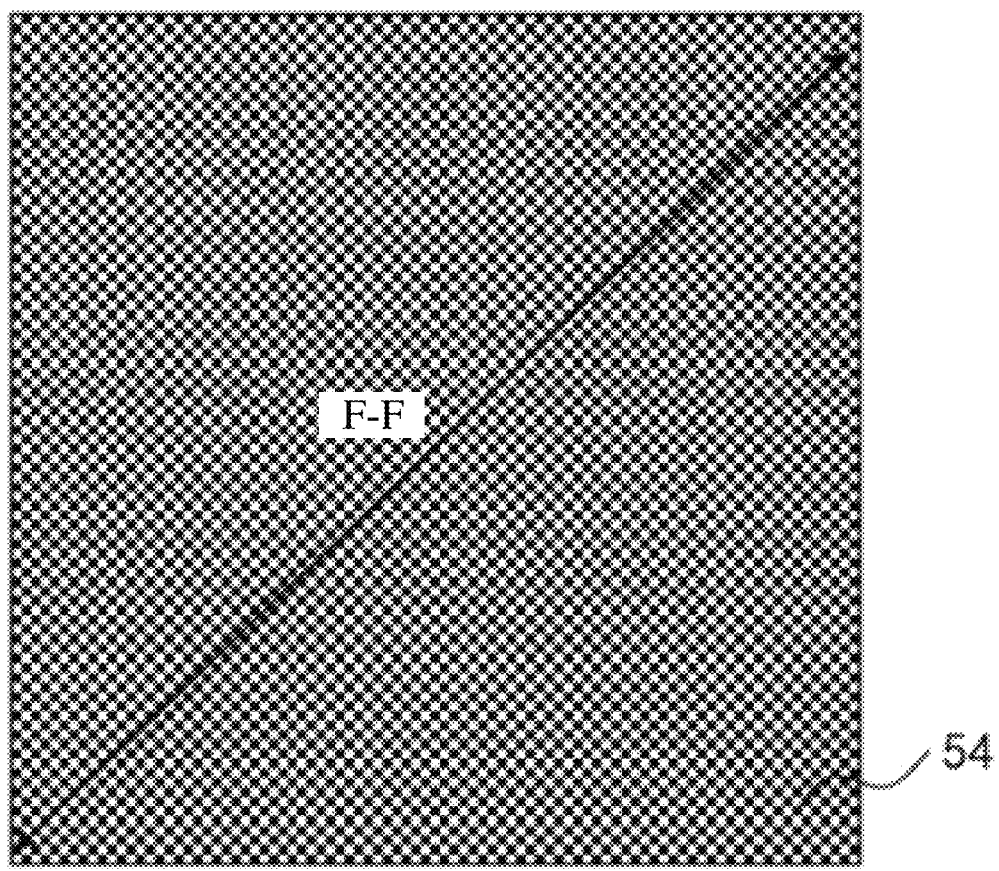
FIG. 13 is a structural top view illustrating that a first mask layer, a first oxide layer, an electrically conductive material layer, a second oxide layer and a second mask layer are formed in a manufacturing method of a semiconductor structure according to one exemplary embodiment.
Figure 14:
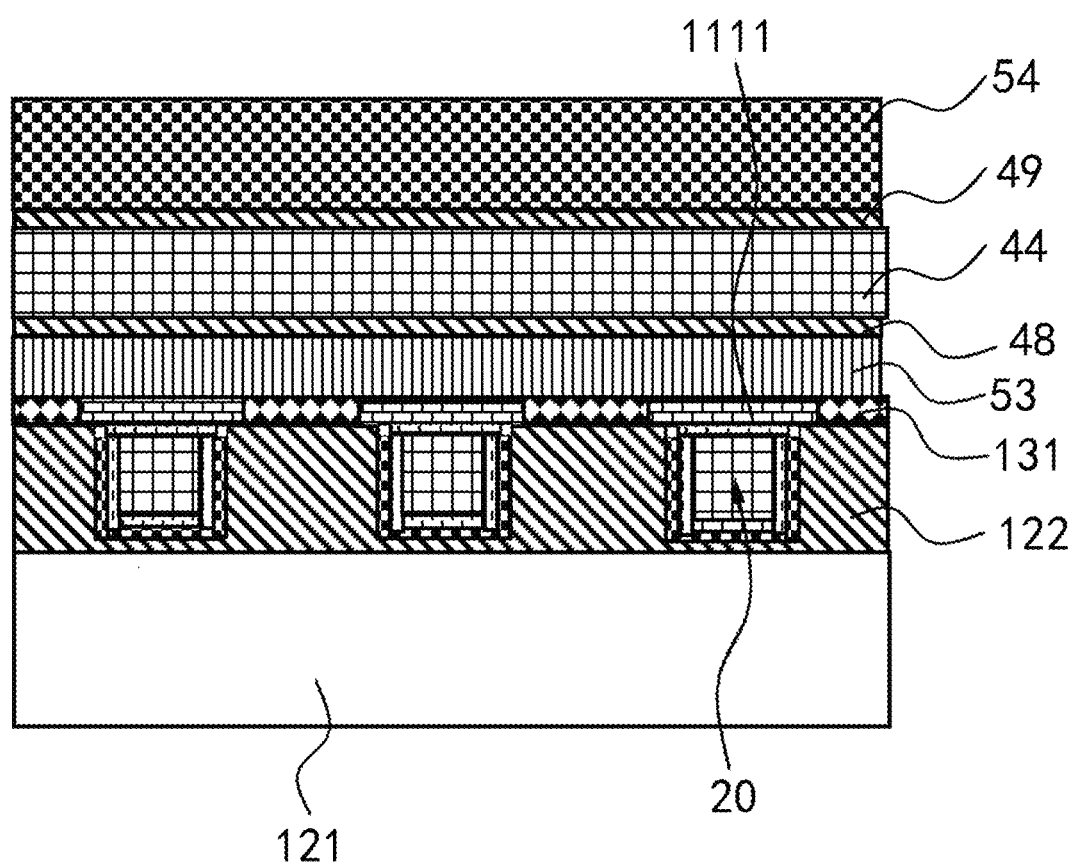
FIG. 14 is a cross-sectional structural view at F-F in FIG. 13.
Figure 15:
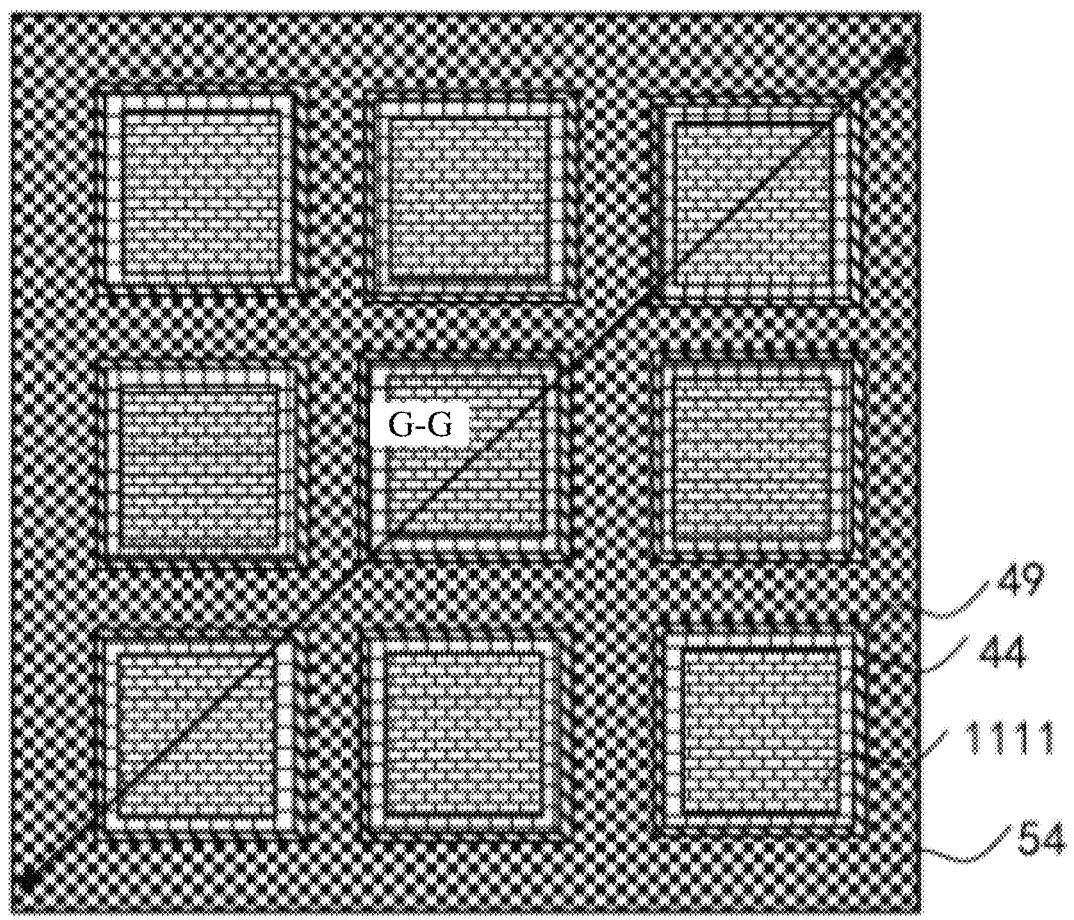
FIG. 15 is a structural top view illustrating that holes are formed in a manufacturing method of a semiconductor structure according to one exemplary embodiment.
Figure 16:
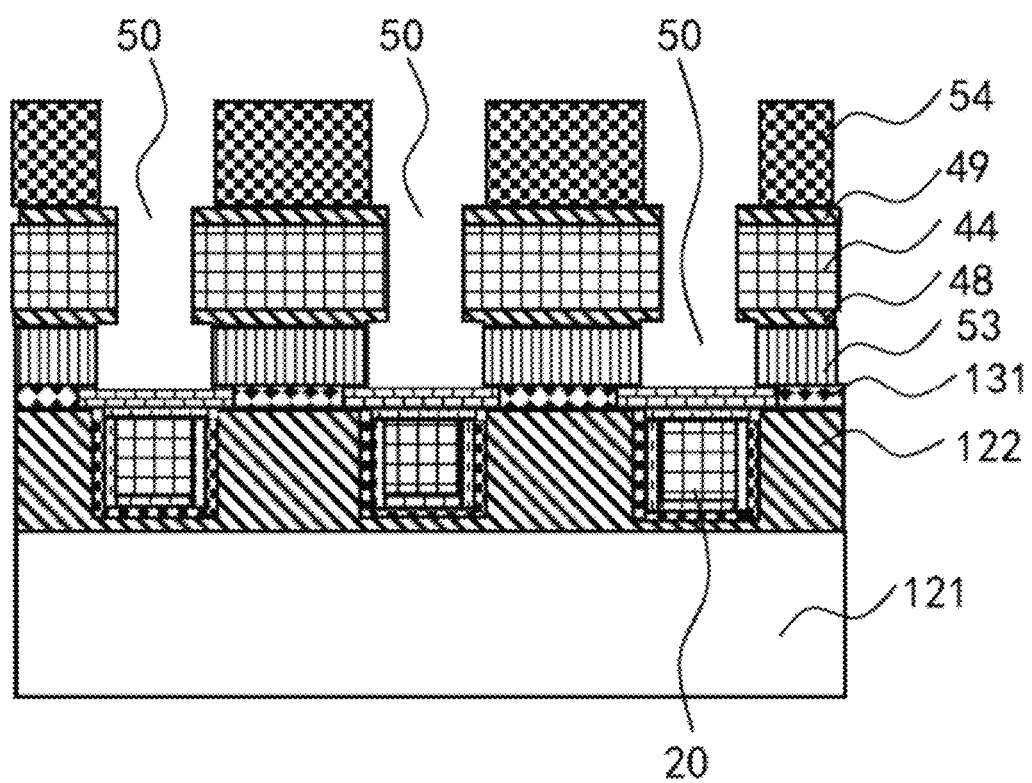
FIG. 16 is a cross-sectional structural view at G-G in FIG. 15.

On the basis of FIG. 13 and FIG. 14, the hole 50 is etched with different etch selectivity ratios, and the hole 50 is dumbbell-shaped, as shown in FIG. 15 and FIG. 16. A third oxide layer 52 is formed on a wall of the hole 50, and a fourth semiconductor layer 42 is formed. That is, the fourth semiconductor layer 42 in the first mask layer 53 is taken as a second segment body 1112, the first segment body 1111 and the second segment body 1112 form a drain region 111, the fourth semiconductor layer 42 in the second mask layer 54 is taken as a source region 113, and the rest of the fourth semiconductor layer 42 is taken as a source region channel 112, as shown in FIG. 17 and FIG. 18.

In one embodiment, an operation that the word lines 30 are formed includes the following operations. The second mask layer 54, the second oxide layer 49, the electrically conductive material layer 44, the first oxide layer 48 and the first mask layer 53 outside areas in which the word lines 30 are located are etched to expose the first insulating medium layer 131 and the first segment bodies 1111, and the rest of the electrically conductive material layer 44 is taken as the word lines 30. A second insulating medium layer 133 is formed on the first insulating medium layer 131 and the first segment bodies 1111, so that the second segment body 1112, the source region channel 112, the source region 113 and the word line 30 are positioned in the second insulating medium layer 133. The first insulating medium layer 131 and the second insulating medium layer 1333 are taken as an isolation structure 13.

Figure 17:
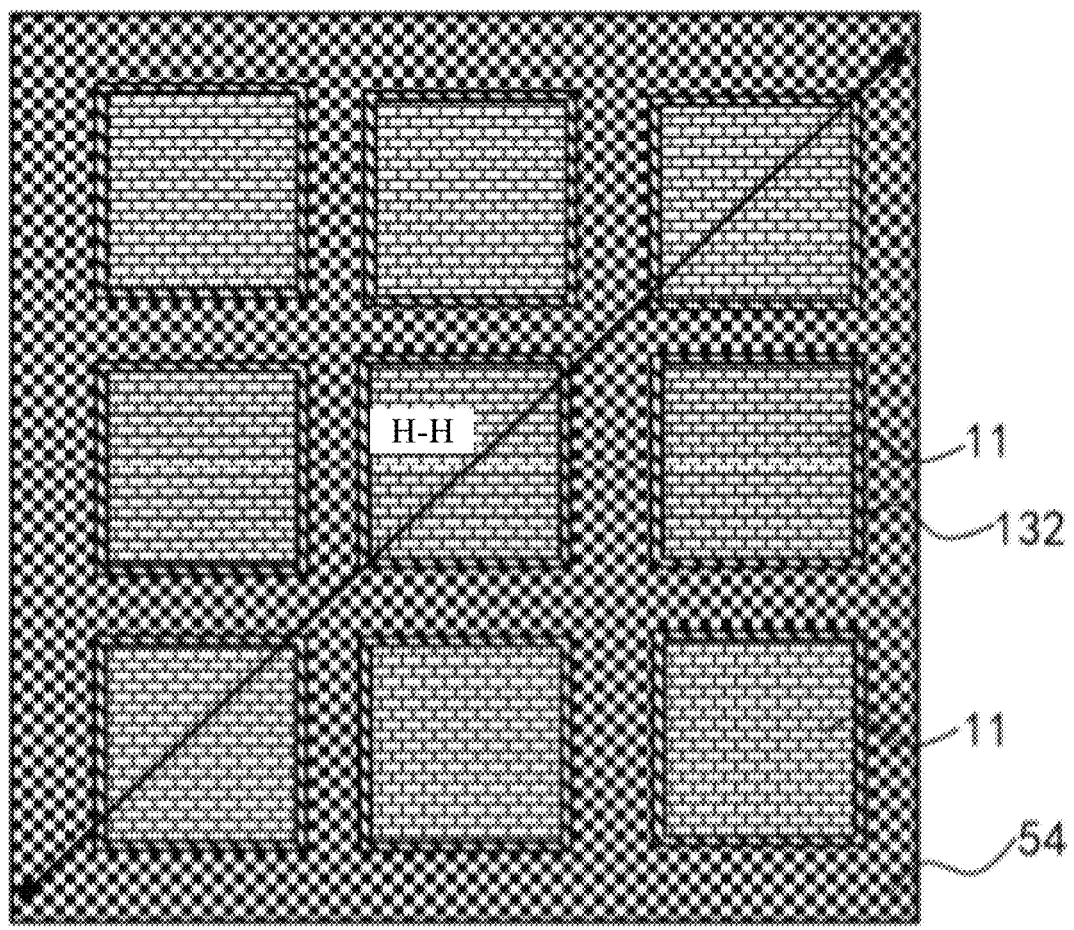
FIG. 17 is a structural top view illustrating that active regions are formed in a manufacturing method of a semiconductor structure according to one exemplary embodiment.
Figure 18:
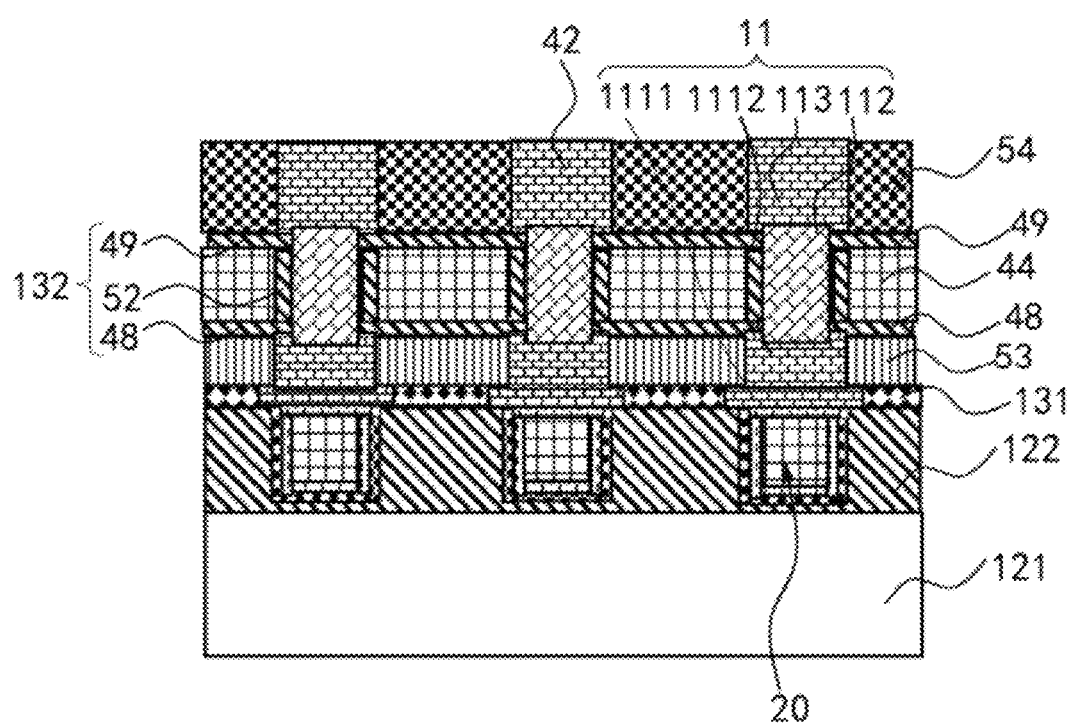
FIG. 18 is a cross-sectional structural view at H-H in FIG. 17.
Figure 19:
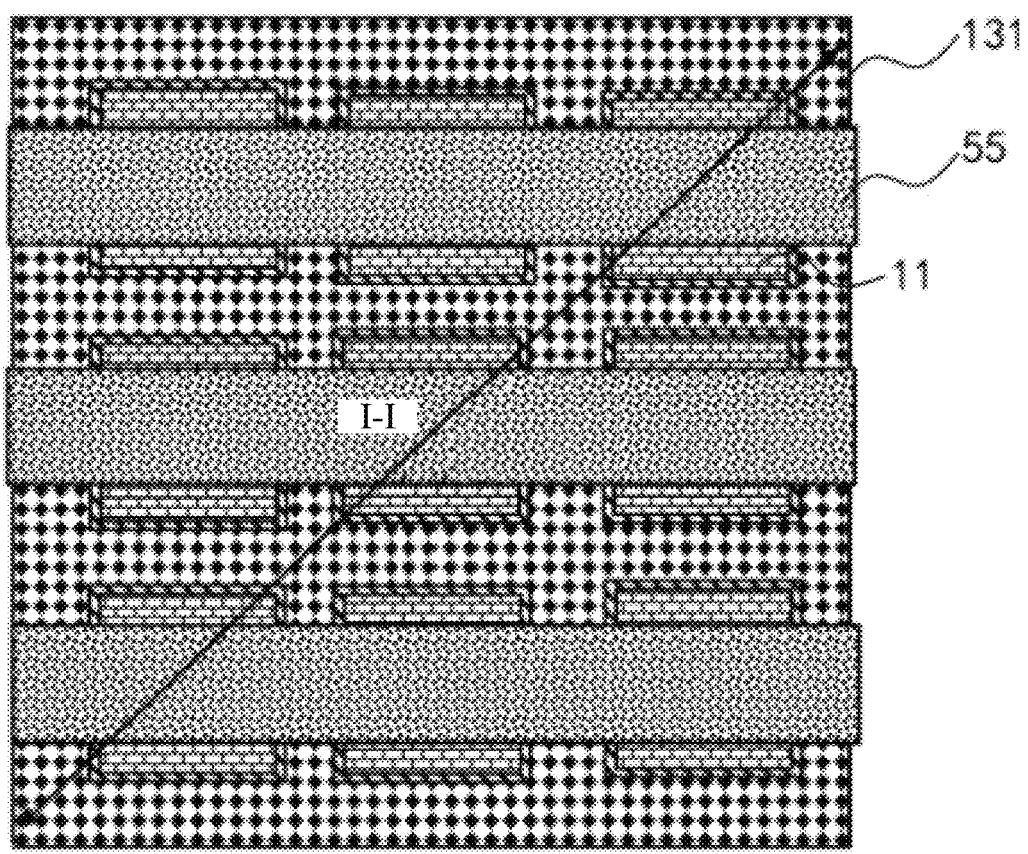
FIG. 19 is a structural top view illustrating that a photoresist layer is formed in a manufacturing method of a semiconductor structure according to one exemplary embodiment.
Figure 20:
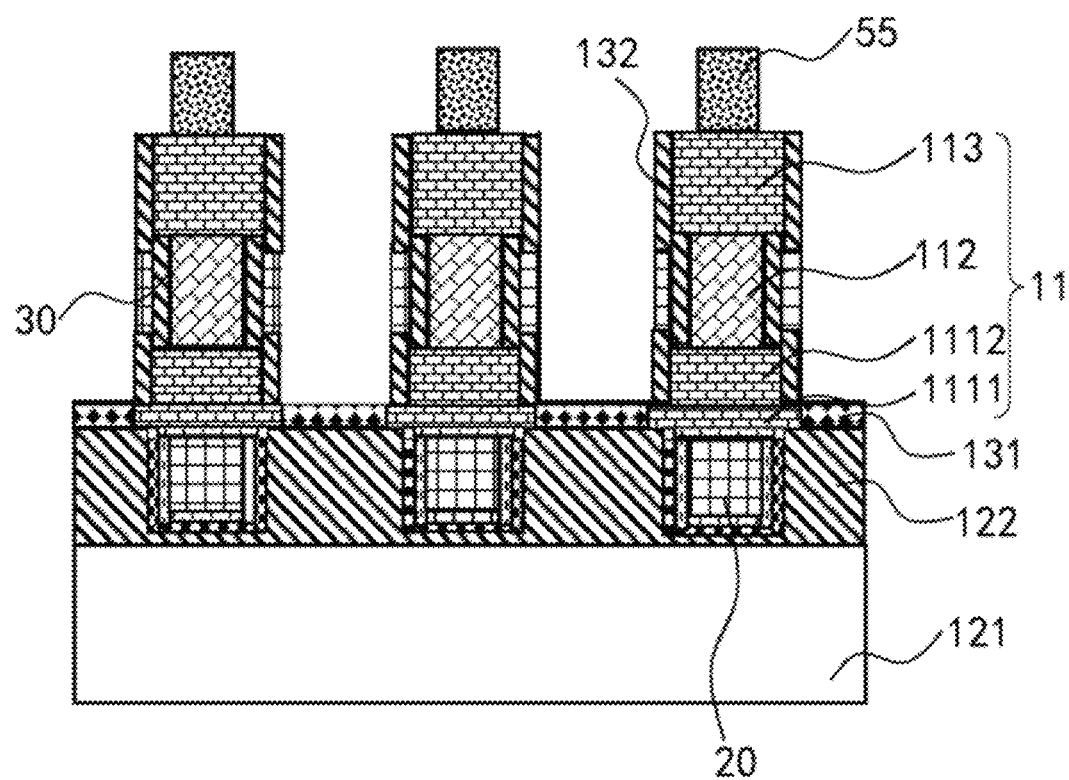
FIG. 20 is a cross-sectional structural view at I-I in FIG. 19.
Figure 21:
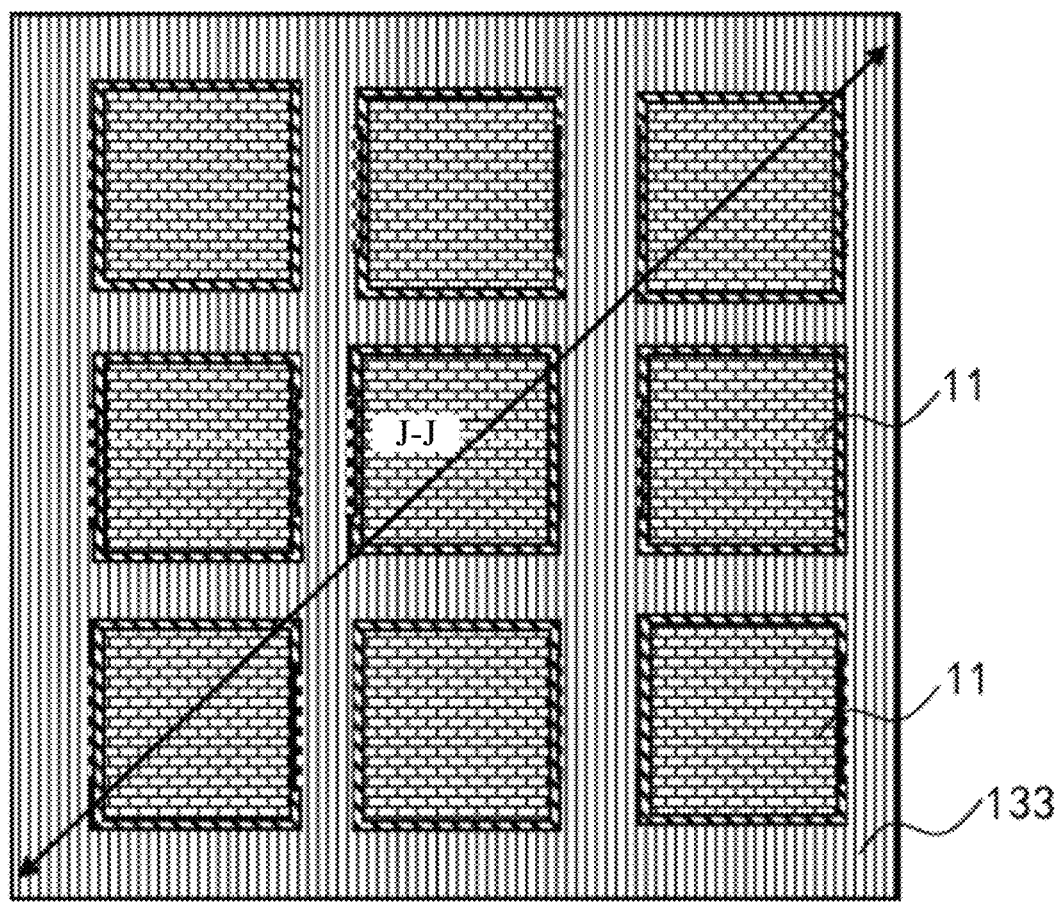
FIG. 21 is a structural top view illustrating that a third insulating medium layer is formed in a manufacturing method of a semiconductor structure according to one exemplary embodiment.
Figure 22:
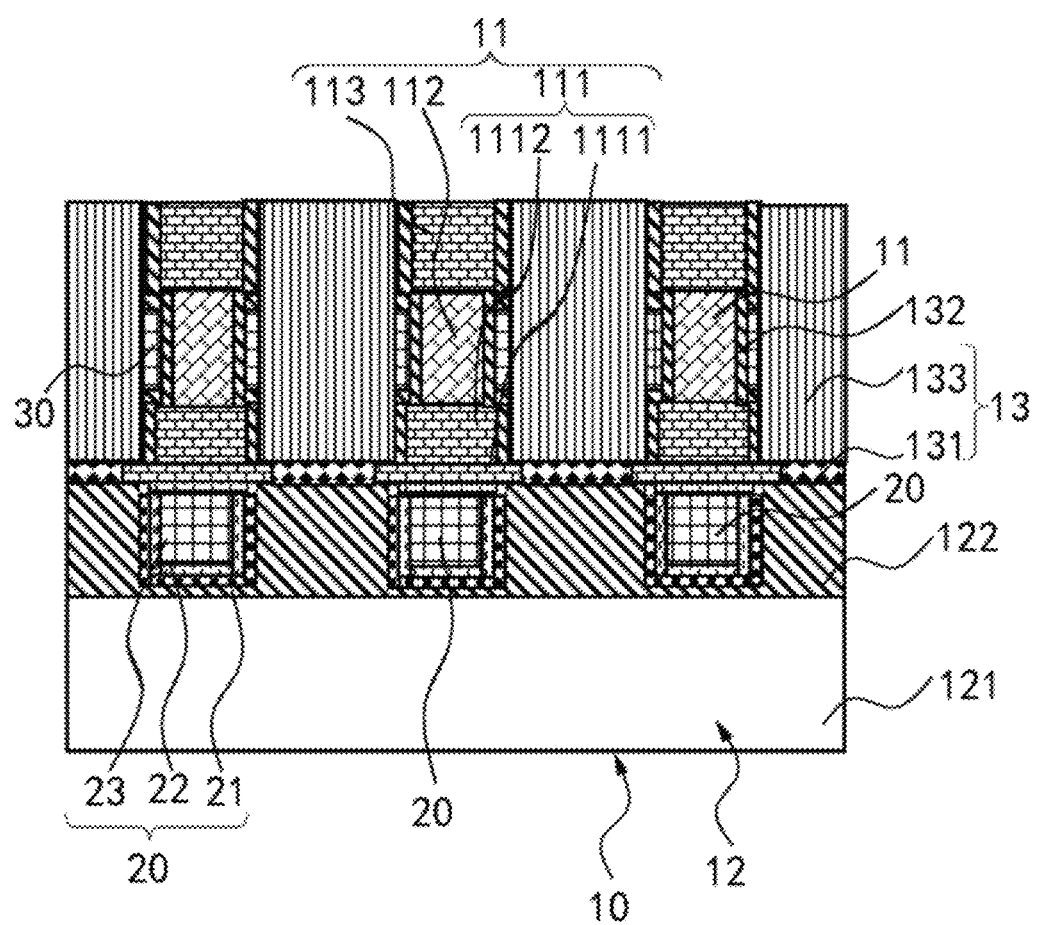
FIG. 22 is a cross-sectional structural view at J-J in FIG. 21.

Specifically, on the basis of FIG. 17 and FIG. 18, photoresist layers 55 are formed in areas in which the word lines 30 are located, and the part outside the photoresist layers 55 is etched to form the word lines 30, as shown in FIG. 19 and FIG. 20. After the photoresist layer 55s are removed, the second insulating medium layer 133 is formed, herein the second insulating medium layer 133 needs to guarantee that the source region 113 may be connected to a memory element (for example, a memory capacitor), as shown in FIG. 21 and FIG. 22.

In one embodiment, the electrically conductive material layer 44 may include tungsten (W), and the first insulating medium layer 131, the gate oxide layer 132 and the second insulating medium layer 133 may be made of an insulating material, for example, silicon dioxide (SiO2), silicon oxycarbide (SiOC), silicon nitride (SiN), silicon carbide nitride (SiCN) and the like, which is not limited herein. In the embodiment, the first oxide layer 48, the second oxide layer 49 and the third oxide layer 52 forming the gate oxide layer 132 may be made of silicon dioxide (SiO2).

It is to be noted that, the first mask layer 53, the second mask layer 54, the first insulating medium layer 131, the first oxide layer 48, the electrically conductive material layer 44, the second oxide layer 49, the third oxide layer 52 and the second insulating medium layer 133 may be formed through a PVD process, a CVD process, an ALD process, a RPN process, a thermal oxidization process, an In-Situ Steam Generation (ISSG) process, a Spin On Dielectric (SOD) process and the like, which may be not limited herein.

In one embodiment, each of the second semiconductor layer 123 and the third semiconductor layer 41 may be made of monocrystalline silicon, and the third semiconductor layer 41 is generated on the second semiconductor layer 123 through an Epitaxial Growth (Epi) process. That is, after the second semiconductor layer 123 and the third semiconductor layer 41 are formed as monocrystalline silicon, the monocrystalline silicon is doped in situ or ion implanted to form the first segment bodies 1111. The second semiconductor layer 123 may be formed through the Epi process.

In one embodiment, the fourth semiconductor layer 42 is made of monocrystalline silicon, and after monocrystalline silicon is generated based on the first segment body 1111 through the Epi process, the monocrystalline silicon is doped in situ or ion implanted to form the second segment body 1112, the source region channel 112 and the source region 113.

In the embodiment, the Epi process may be a selective Epi process.

It is to be noted that, the drain region 111, the source region channel 112 and the source region 113 respectively form a drain, a trench region and a source of the vertical type memory transistor. The drain region 111, the source region channel 112 and the source region 113 include a first doping, a second doping and a third doping respectively. The first doping and the third doping are a doping of a first electrically conductive type, and the second doping is a doping of a second electrically conductive type opposite to the first electrically conductive type. The doping of the first electrically conductive type may be P type doping and the doping of the second electrically conductive type may be N type doping. Or, the doping of the first electrically conductive type may be N type doping and the doping of the second electrically conductive type may be P type doping. The source region 113 is connected to a memory element (for example, a memory capacitor).

It is to be noted that, a Chemical Mechanical Polishing (CMP) process is a commonly used process which can cooperate with formation of a semiconductor structure. For example, the formed third semiconductor layer 41 may be ground and flattened through the CMP process. Accordingly, during the forming processing of the first insulating medium layer 131 and the second insulating medium layer 133, the first insulating medium layer 131 and the second insulating medium layer 133 also may be ground and flattened through the CMP process, which may be not limited herein and may be selected according to the specific needs.

One embodiment of the disclosure further provides a semiconductor structure. Referring to FIG. 21 and FIG. 22, the semiconductor structure includes: a semiconductor body 10, bit lines 20 and word lines 30. The semiconductor body includes a substrate 12 and an isolation structure 13 above the substrate 12. The isolation structure 13 is configured to isolate a plurality of active regions 11, and part of the active region 11 is formed from the substrate 12. The bit lines 20 are positioned in the substrate 12 and the bit lines are connected to the active regions 11. The word lines 30 intersect with the active regions 11 and surround the active regions 11. The substrate 12 is an SOI substrate.

According to the semiconductor structure of one embodiment of the disclosure, the bit lines 20 are positioned in the SOI substrate, and connected to the active regions 11. The word lines 30 and the active regions 11 are positioned in the isolation structure 13. The word lines 30 intersect with the active regions 11 and surround the active regions 11. In such a manner, the unit configuration size on the semiconductor substrate 10 is small, that is, the size of the semiconductor structure is further reduced, and the control ability of the buried type bit line 20 is stronger, so that the performance of the semiconductor structure is improved.

It is to be noted that, part of the active region 11 is formed from the substrate 12, i.e., the substrate 12 includes a semiconductor material layer, to server as the active regions 11 in a process of forming the semiconductor structure.

In one embodiment, as shown in FIG. 22, the bit line 20 includes: a bit line isolation layer 21 positioned in the substrate 12; a blocking layer 22 covering an inner surface of the bit line isolation layer 21; and an electrically conductive layer 23 arranged in the blocking layer 22, the blocking layer 22 covering an upper surface of the conductive layer 23, and the blocking layer 22 being connected to the active region 11.

In one embodiment, there are a plurality of bit lines 20 extending in a first preset direction and a plurality of word lines 30 extending in a second preset direction. The first preset direction is perpendicular to the second preset direction.

In one embodiment, part of the active region 11 is formed from the SOI substrate or the active region 11 does not include the SOI substrate.

In one embodiment, the substrate 12 includes: a first semiconductor layer 121; an oxide insulation layer 122 which is positioned on the first semiconductor layer 121 and in which a bit line 20 is positioned; and a second semiconductor layer 123 positioned on the oxide insulation layer 122, an isolation structure 13 being positioned on the oxide insulation layer 122 and covering the second semiconductor layer 123. The active region 11 includes the second semiconductor layer 123.

It is to be noted that, the first semiconductor layer 121, the oxide insulation layer 122 and the second semiconductor layer 123 form a Silicon-On-Insulator (SOI) in which the bit line 20 is arranged. In a manufacturing process of the semiconductor structure, part of the second semiconductor layer 123 is removed, and the finally remaining part serves as the active regions 11.

In one embodiment, a bottom end of the bit line 20 is in contact with the oxide insulation layer 122, that is, the bit line 20 is positioned in the oxide insulation layer 122 to ensure reliable isolation of the bit line 20.

In one embodiment, a top end of the bit line 20 is not higher than a lower surface of the second semiconductor layer 123, that is, the top end of the bit line 20 may be flush with an upper surface of the oxide insulation layer 122, or the top end of the bit line 20 may be positioned below the upper surface of the oxide insulation layer 122.

In one embodiment, a thickness, in a second direction, of the oxide insulation layer 122 is greater than 100 nm, the second direction being perpendicular to the first semiconductor layer 121.

In one embodiment, a thickness, in the second direction, of the bit line 20 is 40 nm to 70 nm.

In one embodiment, a thickness, in a first direction, of the bit line 20 is 30 nm to 70 nm, the first direction being perpendicular to the second direction.

It is to be noted that, the second direction may be understood as a vertical direction, and the first direction may be understood as a horizontal direction. Moreover, it may be further explained in combination with FIG. 22 that the first direction is a horizontal direction parallel to a longitudinal section of the semiconductor structure.

In one embodiment, the active regions 11 each includes a drain region 111. The drain region 111 includes: a first segment body 1111, part of the first segment body 1111 being formed from the substrate 12; and a second segment body 1112 positioned above the first segment body 1111. A thickness, in a first direction, of the first segment body 1111 is greater than a thickness, in the first direction, of the second segment body 1112. The first direction is parallel to the substrate 12.

In one embodiment, as shown in FIG. 22, the active regions 11 each includes: a drain region 111 connected to the bit line 20, at least part of the drain region 111 being formed through an Epi process; a source region channel 112 positioned above the drain region 111; and a source region 113 positioned above the source region channel 112. The drain region 111 includes a second semiconductor layer 123.

Specifically, the active regions 11 each includes a drain region 111, a source region channel 112 and a source region 113, which respectively form a drain, a trench region and a source of a vertical type memory transistor. The drain region 111, the source region channel 112 and the source region 113 are vertically arranged in a height direction. Moreover, the drain region 111 is positioned above the bit line 20 and is connected with the bit line 20. As such, a bit line contact hole connecting the bit line 20 is omitted and the unit configuration size of the vertical type memory transistor on the substrate 12 is small (for example, the unit configuration size is 4F2), and therefore, the size of a memory may be correspondingly further reduced.

In one embodiment, as shown in 22, the drain region 111 includes: a first segment body 1111, part of the first segment body 1111 is formed from the second semiconductor layer 123; and a second segment body 1112 positioned above the first segment body 1111. The thickness, in the first direction, of the first segment body 1111 is greater than the thickness, in the first direction, of the second segment body 1112, the first direction being parallel to the substrate 12.

Specifically, a cross sectional area of the first segment body 1111 is greater than a cross sectional area of the second segment body 1112, but the thickness, in the second direction, of the first segment body 1111 is smaller than the thickness, in the second direction, of the second segment body 1112. In addition, part of the first segment body 1111 is formed from the second semiconductor layer 123, namely from the substrate 12.

The second segment body 1112, the source region channel 112 and the source region 113 form a dumbbell-shaped structure.

In one embodiment, as shown in FIG. 22, the semiconductor structure further includes a gate oxide layer 132. The gate oxide layer 132 is positioned on the first segment body 1111. The gate oxide layer 132 covers a top end of the first segment body 1111, a side wall and a top end of the second segment body 1112, a side wall of the source region channel 112 and a bottom end and a side wall of the source region 113. The gate oxide layer 132 is arranged between the word line 30 and the source region channel 112. The active region 11 is isolated from the word line 30 through the gate oxide layer 132 which may be an oxide layer, that is, the gate oxide layer 132 forms an annular gate oxide layer for isolating the active region 11 from the word line 30.

In one embodiment, the isolation structure 13 includes: a first insulating medium layer 131 positioned on the substrate 12 and covering the side wall of the first segment body 1111; and a second insulating medium layer 133 positioned on the first insulating medium layer 131. The second segment body 1112, the source region channel 112, the source region 113 and the word line 30 are all positioned in the second insulating medium layer 133. The active region 11 is isolated from the word line 30 through a gate oxide layer 132 which may be an oxide layer. Isolation between adjacent two word lines 30 can be achieved through the second insulating medium layer 133, that is, the word line 30 and the active region 11 are buried into the isolation structure 13.

Specifically, the gate oxide layer 132 surrounds and covers side walls of the second segment body 1112, of the source region channel 112 and of the source region 113. The second insulating medium layer 133 is in direct contact with the first insulating medium layer 131. The second insulating medium layer 133 allows the top end of the source region 113 to be exposed, and the top end of the source region 113 is connected to a memory element (for example, a memory capacitor).

In one embodiment, the thickness, in the first direction, of the first segment body 1111 is greater than the thickness, in the first direction, of the bit line 20. In the embodiment, the thickness, in the first direction, of the first segment body 1111 is greater than the thickness, in the first direction, of the bit line 20 by 3 nm to 10 nm.

In one embodiment, the thickness, in the first direction, of the second segment body 1112 is greater than the thickness, in the first direction, of the source region channel 112, and the thickness, in the first direction, of the source region 113 is greater than the thickness, in the first direction, of the source region channel 112. The word line 30 intersects with the source region channel 112, that is, in terms of a spatial concept, the word line 30 is positioned between the drain region 111 and the source region 113, and the thickness, in the first direction, of the word line 30 may not be increased due to the presence of the source region channel 112.

It is to be noted that, each word line 30 intersects with a plurality of active regions 11. The intersection herein refers to the intersection in the spatial relationship, and does not specifically refer to the contact of the word line with the active regions.

In one embodiment, a vertical type memory transistor is formed in an overlapped area in which the bit line 20 spatially intersects with the word line 30, and the vertical type memory transistor is positioned on the bit line 20 and connected to the bit line 20. One overlapped area corresponds to one vertical type memory transistor. The unit configuration size, on the semiconductor substrate 10, of the vertical type memory transistor is greater than or equal to 4 times the square of the minimum feature size.

In one embodiment, a vertical type memory transistor is formed in an overlapped area in which the bit line 20 spatially intersects with the word line 30. The vertical type memory transistor is positioned on the bit line 20 and connected to the bit line 20. The width size D1, in a direction perpendicular to the bit line 20, of one vertical type memory transistor is twice the minimum feature size, and the width size D2, in a direction perpendicular to the word line 30, of one vertical type memory transistor is twice the minimum feature size.

It is to be noted that, the bit line 20 and the word line 30 each are formed with the minimum feature size F, and the line spacing between adjacent bit lines 20 and the line spacing between adjacent word lines 30 are greater than or equal to the minimum feature size. The width size, in the direction perpendicular to the bit line, of one vertical type memory transistor is 2F, and the width size, in the direction perpendicular to the word line, of one vertical type memory transistor is also 2F, and accordingly the unit configuration size of the vertical type memory transistor may be 4F2 (2F*2F, namely a 2×2 buried type bit line structure). That is, the unit configuration size of the vertical type memory transistor is greater than or equal to 4 times the square of the minimum feature size. Compared with a 3×2 buried type word line structure, the unit configuration size is smaller, namely bulk density is higher.

In one embodiment, a semiconductor structure may be obtained through the manufacturing method of the semiconductor structure.

It is to be noted that, the material of each structure layer of the semiconductor structure may refer to the material as described in the manufacturing method of the semiconductor substrate, which is not described again herein.

Other embodiments of the disclosure will be easily conceivable for those skilled in the art after consideration of the specification and practice of the invention disclosed here. The disclosure is intended to cover any variations, uses, or adaptations of the embodiment, and the variations, uses, or adaptations follow the general principles of the disclosure and include common general knowledge or conventional technical means in the art undisclosed by the disclosure. The specification and exemplary embodiments are considered as examples only, and a true scope and spirit of the disclosure are indicated by the claims.

It will be appreciated that the disclosure is not limited to the exact structure that has been described above and illustrated in the accompanying drawings, and that various modifications and changes can be made without departing from the scope thereof. The scope of the disclosure is only limited by the appended claims.

The invention claimed is:

1. A semiconductor structure, comprising:
 a semiconductor body which comprises a substrate and an isolation structure positioned above the substrate and configured to isolate a plurality of active regions, wherein part of each of the active regions is formed from the substrate;
 bit lines positioned in the substrate and connected to the active regions; and
 word lines intersecting with the active regions and surrounding the active regions; and,
 wherein the substrate is a Silicon On Insulator (SOI) substrate, wherein
 the substrate comprises: a first semiconductor layer, an oxide insulation layer positioned on the first semiconductor layer, and a second semiconductor layer positioned on the oxide insulation layer;
 the bit lines are positioned in the oxide insulation layer, the isolation structure is positioned on the oxide insulation layer and covers the second semiconductor layer;

the active regions each comprises: a drain region connected to a corresponding one of the bit lines, a source region channel positioned above the drain region, and a source region positioned above the source region channel; and wherein at least part of the drain region is formed through an epitaxial growth process, the drain region comprises the second semiconductor layer; and the drain region comprises: a first segment body, part of the first segment body being formed from the second semiconductor layer, and a second segment body positioned above the first segment body; and wherein a thickness, in a first direction, of the first segment body is greater than a thickness, in the first direction, of the second segment body; the first direction is parallel to the substrate.

2. The semiconductor structure of claim 1, further comprising:

a gate oxide layer which covers a top end of the first segment body, a side wall and a top end of the second segment body, a side wall of the source region channel, and a bottom end and a side wall of the source region, wherein a corresponding one of the word lines intersects with the source region channel, and the gate oxide layer is arranged between the corresponding one of the word lines and the source region channel.

3. The semiconductor structure of claim 1, wherein the isolation structure comprises:

a first insulating medium layer positioned on the substrate and covering a side wall of the first segment body; and
a second insulating medium layer positioned on the first insulating medium layer, wherein the second segment body, the source region channel, the source region and a corresponding one of the word lines are all positioned in the second insulating medium layer.

4. The semiconductor structure of claim 1, wherein the thickness, in the first direction, of the first segment body is greater than a thickness, in the first direction, of the corresponding one of the bit lines by 3 nm to 10 nm;

the thickness, in the first direction, of the second segment body is greater than a thickness, in the first direction, of the source region channel, and
a thickness, in the first direction, of the source region is greater than the thickness, in the first direction, of the source region channel.

5. The semiconductor structure of claim 1, wherein the second segment body, the source region channel and the source region form a dumbbell-shaped structure.

6. The semiconductor structure of claim 1, wherein a bottom end of each of the bit lines is in contact with the oxide insulation layer.

7. The semiconductor structure of claim 1, wherein a top end of each of the bit lines is not higher than a lower surface of the second semiconductor layer.

8. The semiconductor structure of claim 1, wherein a vertical type memory transistor is formed in an overlapped area in which a one of the bit lines spatially intersects with a corresponding one of the word lines, the vertical type memory transistor is positioned on the one of the bit lines and connected to the one of the bit lines, one overlapped area corresponds to one vertical type memory transistor, and a unit configuration size, on the semiconductor body, of the vertical type memory transistor is greater than or equal to 4 times a square of a minimum feature size.

9. The semiconductor structure of claim 1, wherein each of the bit lines comprises:

a bit line isolation layer positioned in the substrate;
a blocking layer covering an inner surface of the bit line isolation layer; and
an electrically conductive layer arranged in the blocking layer, the blocking layer covering an upper surface of the electrically conductive layer;
wherein the blocking layer is connected to a corresponding one of the active regions.

10. A manufacturing method of a semiconductor structure, comprising:

forming a substrate which is a Silicon On Insulator (SOI) substrate; and, wherein forming the substrate comprises: providing a first semiconductor layer; forming an oxide insulation layer on the first semiconductor layer; forming a second semiconductor layer on the oxide insulation layer; and forming bit lines in the substrate;

forming the bit lines comprises: forming openings in the substrate, wherein a bottom surface of the openings are positioned in the oxide insulation layer; and forming the bit lines in the openings, and a top end of each of the bit lines is not higher than a lower surface of the second semiconductor layer;

forming a plurality of active regions on the substrate, wherein part of each of the active regions is formed from the substrate, and the bit lines are connected to the active regions; and forming, above the bit lines, word lines which intersect with the active regions and surround the active regions.

11. The manufacturing method of the semiconductor structure of claim 10, wherein forming the active regions comprises:

forming, on the second semiconductor layer, a third semiconductor layer which covers upper surfaces of the bit lines; and
partially etching the second semiconductor layer and the third semiconductor layer to take a remaining portion of the second semiconductor layer and of the third semiconductor layer as first segment bodies.

12. The manufacturing method of the semiconductor structure of claim 11, wherein forming the active regions further comprises:

forming a first insulating medium layer on the oxide insulation layer and covering side walls of the first segment bodies with the first insulating medium layer;
forming a first mask layer on the first insulating medium layer and the first segment bodies;
forming a first oxide layer on the first mask layer;
forming an electrically conductive material layer on the first oxide layer;
forming a second oxide layer on the electrically conductive material layer;
forming a second mask layer on the second oxide layer;
partially etching the second mask layer, the second oxide layer, the electrically conductive material layer, the first oxide layer and the first mask layer in areas in which the first segment bodies are located, to expose the first segment bodies and form holes;
forming a third oxide layer on a wall of each of the holes, the first oxide layer, the second oxide layer and third oxide layer serving as a gate oxide layer; and
forming fourth semiconductor layers in the holes, the fourth semiconductor layers in the first mask layer serving as second segment bodies, the first segment bodies and the second segment bodies serving as drain regions, the fourth semiconductor layers in the second mask layer serving as source regions, and a remaining portion of the fourth semiconductor layers serving as source region channels, wherein the drain regions, the source region channels and the source regions serve as the active regions.

13. The manufacturing method of the semiconductor structure of claim 12, wherein forming the word lines comprises:
etching the second mask layer, the second oxide layer, the electrically conductive material layer, the first oxide layer and the first mask layer outside areas in which the word lines are located, to expose the first insulating medium layer and the first segment bodies, a remaining portion of the electrically conductive material layer serving as the word lines; and
forming a second insulating medium layer on the first insulating medium layer and the first segment bodies, so that the second segment bodies, the source region channels, the source regions and the word lines are all positioned in the second insulating medium layer, the first insulating medium layer and the second insulating medium layer serving as an isolation structure.

14. The manufacturing method of the semiconductor structure of claim 12, wherein the fourth semiconductor layer is monocrystalline silicon, and after the monocrystalline silicon is generated based on the first segment bodies through an epitaxial process, the monocrystalline silicon is doped in situ or ion implanted to form the second segment bodies, the source region channel and the source region.

15. The manufacturing method of the semiconductor structure of claim 11, wherein the third semiconductor layer is monocrystalline silicon, and after the monocrystalline silicon is generated based on the second semiconductor layer through an epitaxial process, the monocrystalline silicon is doped in situ or ion implanted to form the first segment bodies.

* * * * *